US008587921B2

(12) United States Patent
Bar et al.

(10) Patent No.: US 8,587,921 B2
(45) Date of Patent: Nov. 19, 2013

(54) METHOD OF ADJUSTMENT ON MANUFACTURING OF A CIRCUIT HAVING A RESONANT ELEMENT

(75) Inventors: Pierre Bar, Grenoble (FR); Sylvain Joblot, Valbonne (FR); David Petit, Fontaine (FR)

(73) Assignee: STMicroelectronics SA, Montrouge (FR)

( * ) Notice: Subject to any disclaimer, the term of this patent is extended or adjusted under 35 U.S.C. 154(b) by 301 days.

(21) Appl. No.: 12/896,093

(22) Filed: Oct. 1, 2010

(65) Prior Publication Data
US 2011/0080687 A1 Apr. 7, 2011

(30) Foreign Application Priority Data
Oct. 1, 2009 (FR) ...................................... 09 56860

(51) Int. Cl.
*H01G 4/005* (2006.01)
*H01G 4/06* (2006.01)
(52) U.S. Cl.
USPC .......................................... 361/303; 361/311
(58) Field of Classification Search
USPC ............ 361/303, 311, 305; 257/303; 333/187
See application file for complete search history.

(56) References Cited

U.S. PATENT DOCUMENTS

| 5,622,893 | A * | 4/1997 | Summerfelt et al. | 438/396 |
|---|---|---|---|---|
| 6,980,413 | B1 * | 12/2005 | Kim et al. | 361/303 |
| 7,327,582 | B2 * | 2/2008 | Casper et al. | 361/765 |
| 2003/0205948 | A1 | 11/2003 | Lin et al. | |
| 2005/0070127 | A1 | 3/2005 | Clevenger et al. | |
| 2005/0082636 | A1 | 4/2005 | Yashima et al. | |
| 2007/0205849 | A1 * | 9/2007 | Otis | 333/187 |
| 2009/0219668 | A1 * | 9/2009 | Hsu et al. | 361/303 |

* cited by examiner

*Primary Examiner* — Eric Thomas
(74) *Attorney, Agent, or Firm* — Seed IP Law Group PLLC

(57) ABSTRACT

A method of adjustment in the manufacture of a capacitance of a capacitor supported by a substrate, the method including the steps of: a) forming a first electrode parallel to the surface of the substrate and covering it with a dielectric layer; b) forming, on a first portion of the dielectric layer, a second electrode; c) measuring the capacitance between the first electrode and the second electrode, and deducing therefrom the capacitance to be added to obtain the desired capacitance; d) thinning down a second portion of the dielectric layer, which is not covered by the second electrode, so that the thickness of this second portion is adapted to the forming of the deduced capacitance; and e) forming a third electrode on the thinned-down portion and connecting it to the second electrode.

12 Claims, 3 Drawing Sheets

METHOD OF ADJUSTMENT ON MANUFACTURING OF A CIRCUIT HAVING A RESONANT ELEMENT

BACKGROUND

1. Technical Field

The present disclosure relates to a method of adjustment during the manufacture of a capacitor laid on a substrate and, by way of example, the present disclosure relates to a method of manufacturing that provides for adjusting the frequency of a circuit having a resonant element, for example, a monolithic oscillator using bulk acoustic wave (BAW) resonators.

2. Description of the Related Art

Oscillators are mainly used in electronic devices to provide clock signals at reference frequencies. Currently, an oscillator includes oscillating circuit elements and a quartz resonator that enables accurately setting the oscillation frequency. An alternative to quartz oscillators is the use of oscillators based on BAW resonators. The use of BAW resonators enables implementing higher oscillation frequencies, for example, approximately ranging from a few hundreds of MHz to a few tens of GHz. Lower clock frequencies may also be generated by using, at the oscillator output, a frequency-division circuit. Further, BAW resonators have the advantages of having a low bulk and a good quality factor.

It has also been provided to form a monolithic oscillator using a BAW resonator, that is, an oscillator in which the oscillating circuit elements and the resonator are assembled inside and on top of a same integrated circuit chip. The oscillating circuit elements may be formed inside and on top of a semiconductor substrate, for example, a silicon wafer. The BAW resonator is then deposited above this substrate and connected to the oscillating circuit elements. Such an oscillator has the advantages of being very compact and of providing good performance.

FIG. 1 is a cross-section view schematically showing a BAW resonator 1 formed on a semiconductor substrate 3. In this example, the substrate is coated with an insulator 4. Resonator 1 includes a resonator core or piezoelectric resonator 5 formed of two electrodes 5a, 5c between which is arranged a layer 5b of a piezoelectric material. When an electric field is created in the piezoelectric layer by application of a potential difference between electrodes, this results in a mechanical disturbance in the form of acoustic waves. The waves propagate in the resonator. The fundamental resonance establishes when the acoustic wavelength in the piezoelectric material substantially corresponds to twice the thickness of piezoelectric layer 5b.

An acoustic isolation device is provided between the resonator core and the substrate to avoid losing acoustic waves in the substrate. There mainly exist two types of BAW resonators: BAW resonators deposited on a membrane, and BAW resonators mounted on the substrate.

BAW resonators deposited on a membrane, such as the resonator 1, such as FBARs (Film Bulk Acoustic Wave Resonators) or TFRs (Thin Film Resonators) form a recess 7 between the resonator core and the substrate. A membrane 8 supports the various layers of the resonator above the recess 7.

BAW resonators mounted on the substrate, or SMRs (Solidly Mounted Resonators), are generally isolated from the substrate by an acoustic reflector, currently a Bragg mirror.

FIG. 2 shows a simplified electric diagram of an oscillator with a BAW resonator 25. This oscillator has various elements of a circuit 23, connected between a high voltage power supply terminal $V_{CC}$ and a terminal of low voltage, for example, the ground, and the BAW resonator 25, connected to circuit elements 23.

The circuit 23 especially includes active elements capable of sustaining oscillations and of amplifying an output signal OUT, and passive elements, for example, capacitors. The BAW resonator 25 enables to select the oscillation frequency.

FIG. 3 shows the circuit of FIG. 2 in a more detailed fashion in which the circuit 23 is a Colpitts oscillator. In this example, the circuit 23 more particularly includes a MOS transistor 31 series-connected with a current source 33 between a high supply voltage terminal $V_{CC}$ and the ground. Two capacitors 35 and 37 are series-connected between the gate of transistor 31 and the ground. A resistor 39 is connected between high voltage power supply terminal $V_{CC}$ and the gate of the transistor 31. The terminal or node common to the capacitors 35 and 37 is connected to the drain of the transistor 31. The BAW resonator 25 is connected between the gate of the transistor 31 and the ground. The oscillator output is connected to the source of the transistor 31.

The transistor 31 and the current source 33 amplify the output signal and sustain the oscillations. The frequency of output signal OUT is especially dependent on the resonance frequency of the resonator 25 and on the capacitances of the capacitors 35 and 37.

In practice, it is difficult in manufacturing to obtain an oscillation frequency with the desired accuracy.

A first source of inaccuracy is due to the BAW resonator manufacturing dispersions. Indeed, methods of deposition of the different layers of a BAW resonator do not enable obtaining a resonance frequency with the desired accuracy. Substantial variations of the resonance frequency can especially be observed between resonators formed from a same substrate wafer.

For this reason, as illustrated in FIG. 1, a frequency adjustment layer 9, for example made of silicon nitride, is provided at the surface of the resonator 1. The presence of this layer modifies the behavior of the resonator, and especially its resonance frequency. In a manufacturing step, the layer 9 is thinned down by local etching, for example, by ion etching, to get closer to the aimed resonance frequency.

Despite this adjustment, the accuracy of the BAW resonators is not ideal.

A second source of inaccuracy results from manufacturing discrepancies in the elements of circuit 23. Indeed, despite the attention brought to the forming of these elements, behavior differences can be observed between circuits formed inside and on top of a same substrate wafer.

To overcome this lack of accuracy, a variable capacitance, for example a network of switched capacitors, is generally used in the circuit 23, at least for a portion of one of the two capacitors 35 and 37. The frequency of the output signal of each oscillator can thus be finely corrected in a final calibration step when the BAW resonator is connected to the circuit 23 and the oscillator is powered.

A disadvantage of this calibration mode is that, to be able to compensate for the above-mentioned significant inaccuracy of the oscillation frequency, a large network of switched capacitors must be provided.

BRIEF SUMMARY

The present disclosure overcomes all or part of the disadvantages of conventional oscillators using BAW resonators.

One embodiment of the present disclosure provides a method for forming oscillators with BAW resonators that minimizes the inaccuracy of the oscillation frequency, and minimizing or suppressing the calibration switched capacitor network.

The present disclosure also provides a method of adjustment in the manufacture of a circuit having a resonant element, and a method of adjustment in the manufacture of the capacitance of a capacitor.

Thus, the present disclosure provides a method of adjustment in the manufacture of the capacitance of a capacitor supported by a substrate, this method including the steps of: a) forming a first electrode parallel to the surface of the substrate and covering it with a dielectric layer; b) forming, on a first portion of the dielectric layer, a second electrode; c) measuring the capacitance between the first electrode and the second electrode, and deducing therefrom the capacitance to be added to obtain the desired capacitance; d) thinning down a second portion of the dielectric layer that is not covered by the second electrode so that the thickness of this second portion is adapted to the forming of the deduced capacitance; and e) forming a third electrode on the thinned-down portion and connecting it to the second electrode.

Another embodiment of the present disclosure provides a method of adjustment in the manufacture of an oscillator having circuit elements and a resonator, this oscillator further including a capacitor connected to the circuit elements so that the oscillation frequency depends on the capacitance of the capacitor, this method includes the steps of: forming the circuit elements and the resonator and connecting them; and forming, connecting, and adjusting the capacitor by the above-mentioned method; and step c) of measurement of the capacitance to be added further including an intermediary step of measurement of the output frequency of the circuit.

According to an embodiment of the present disclosure, thinning-down step d) is performed by ion etching of the second portion of the dielectric layer.

According to an embodiment of the present disclosure, the resonator is a BAW resonator deposited on a membrane. According to an embodiment of the present disclosure, the resonator is a BAW resonator with a Bragg mirror.

According to an embodiment of the present disclosure, the electrodes and the dielectric layer of the capacitor are made of the same materials as the BAW resonator.

According to an embodiment of the present disclosure, the first and second electrodes are made of molybdenum, the third electrode is made of a copper and aluminum alloy, and the dielectric layer is made of silicon oxide.

According to an embodiment of the present disclosure, the third electrode covers all or part of the second electrode to provide an electric contact between these two electrodes.

According to an embodiment of the present disclosure, the second and third electrodes are electrically interconnected by a wire.

According to an embodiment of the present disclosure, the resonator is a MEMS-based resonator.

An embodiment of the present disclosure provides a capacitor supported by a substrate and including a first electrode parallel to the surface of the substrate; on the first electrode, a dielectric layer having a first region, and a second region against the first region of a smaller thickness than the first region; a second electrode covering the first region; and a third electrode covering the second region and covering all or part of the second electrode so that the second and third electrodes are electrically interconnected.

In accordance with another aspect of the present disclosure, a method of forming a capacitor with a specified capacitance in conjunction with a BAW resonator on a semiconductor substrate is provided. The method includes forming a first electrode on the substrate; forming a dielectric layer over the first electrode; forming a second electrode over a portion of the dielectric layer that is over a portion of the first electrode to leave a remaining uncovered portion of the dielectric over the first electrode; measuring capacitance between the first and second electrodes and determining a thickness of the uncovered portion of the dielectric layer to obtain the specified capacitance; reducing a thickness of the uncovered portion of the dielectric layer over the first electrode to a thickness that will result in the specified capacitance; and forming a third electrode over the uncovered portion of the dielectric layer and in contact with the second electrode to obtain the capacitor with the specified capacitance.

In accordance with another aspect of the present disclosure, a capacitor is provided, the capacitor including a first electrode formed on a semiconductor substrate to form a first plate; a dielectric layer formed over the first electrode; a second electrode formed over a first portion of the dielectric layer that is over the first electrode; a third electrode formed over a second portion of the dielectric that is over the first electrode and in contact with the second electrode to form a second plate; and wherein the second portion of the dielectric layer has a thickness that is smaller than a thickness of the first portion of the dielectric layer.

In accordance with another aspect of the present disclosure, the second portion of the dielectric layer is formed by measuring capacitance between the first and second dielectric layers prior to forming the third electrode and determining a thickness of the second portion of the dielectric layer to obtain a specified capacitance; reducing a thickness of the second portion of the dielectric layer over the first electrode to a thickness that will obtain the specified capacitance; and forming the third electrode over the second portion of the dielectric layer and in contact with the second electrode to obtain the specified capacitance.

The foregoing features and advantages of the present disclosure will be discussed in detail in the following non-limiting description of specific embodiments in connection with the accompanying drawings.

DETAILED DESCRIPTION

Figure 1:
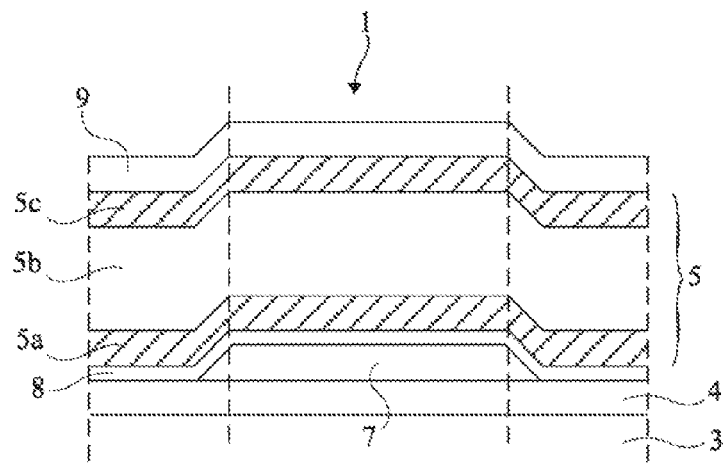
FIG. 1, previously described, is a cross-section view schematically showing a BAW resonator.

For clarity, the same elements have been designated with the same reference numerals in the different drawings and, further, as usual in the representation of integrated circuits, the various drawings are not to scale.

Figure 4:
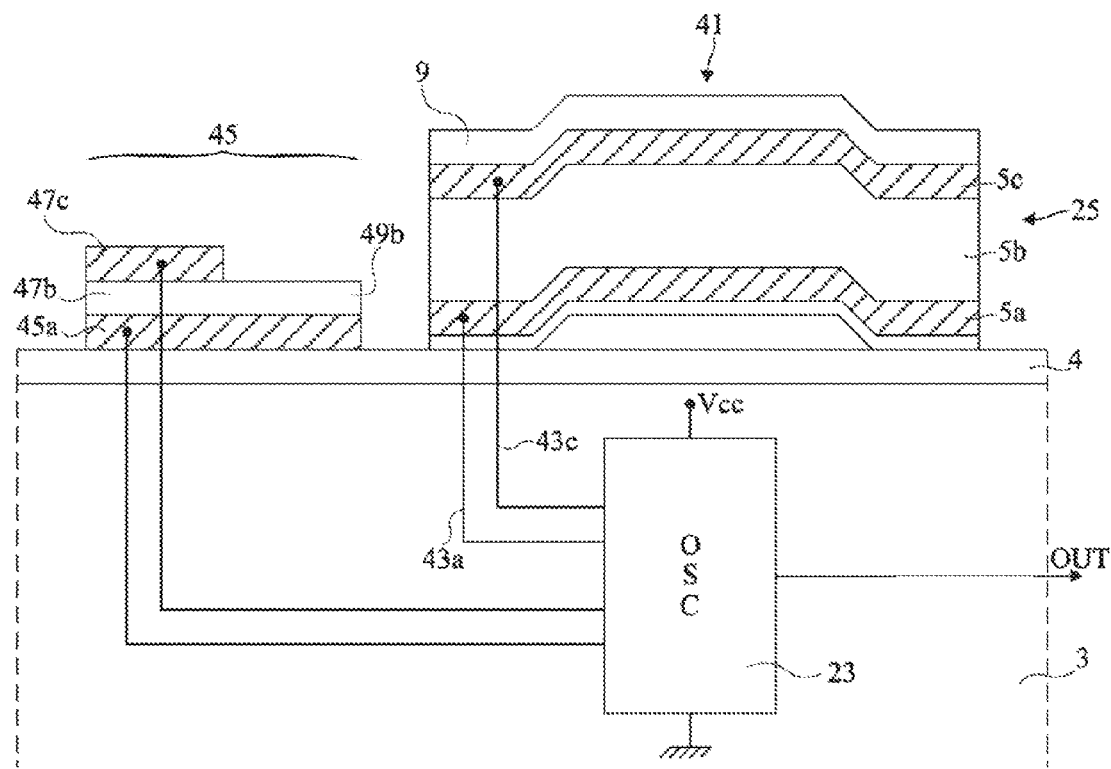
FIGS. 4 to 6 are cross-section views schematically illustrating steps of an example of a method of adjustment in the manufacture of an oscillator with a BAW resonator.
Figure 5:
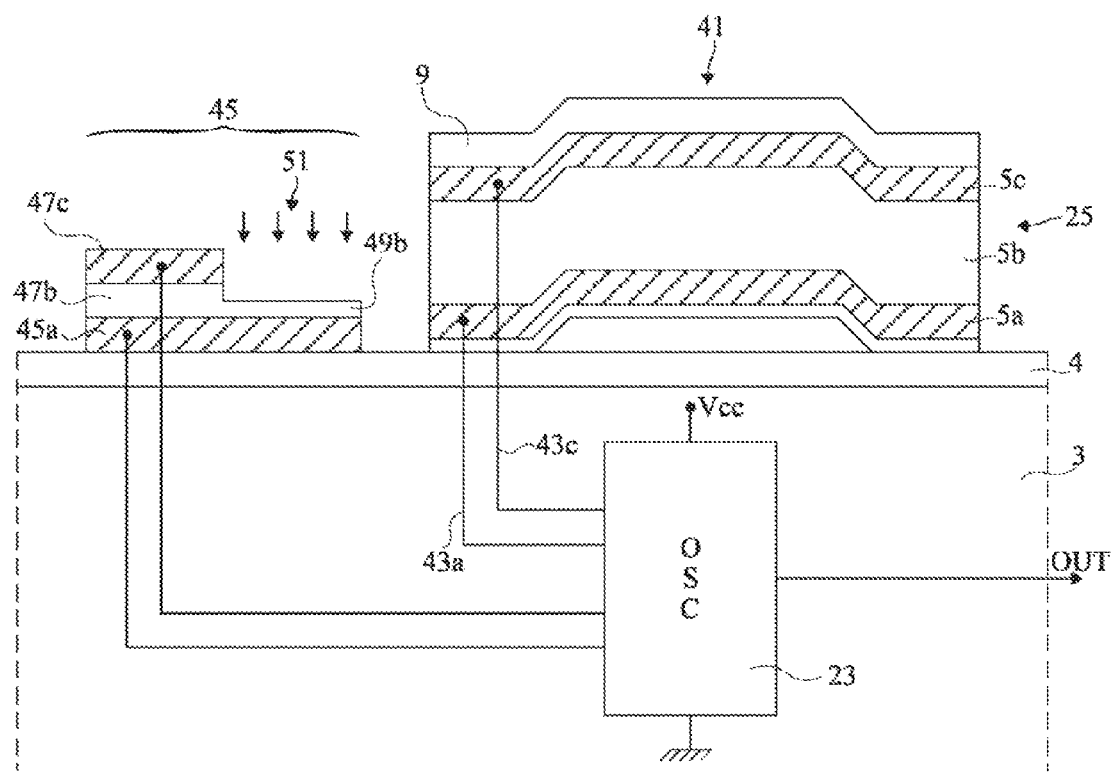
Figure 6:
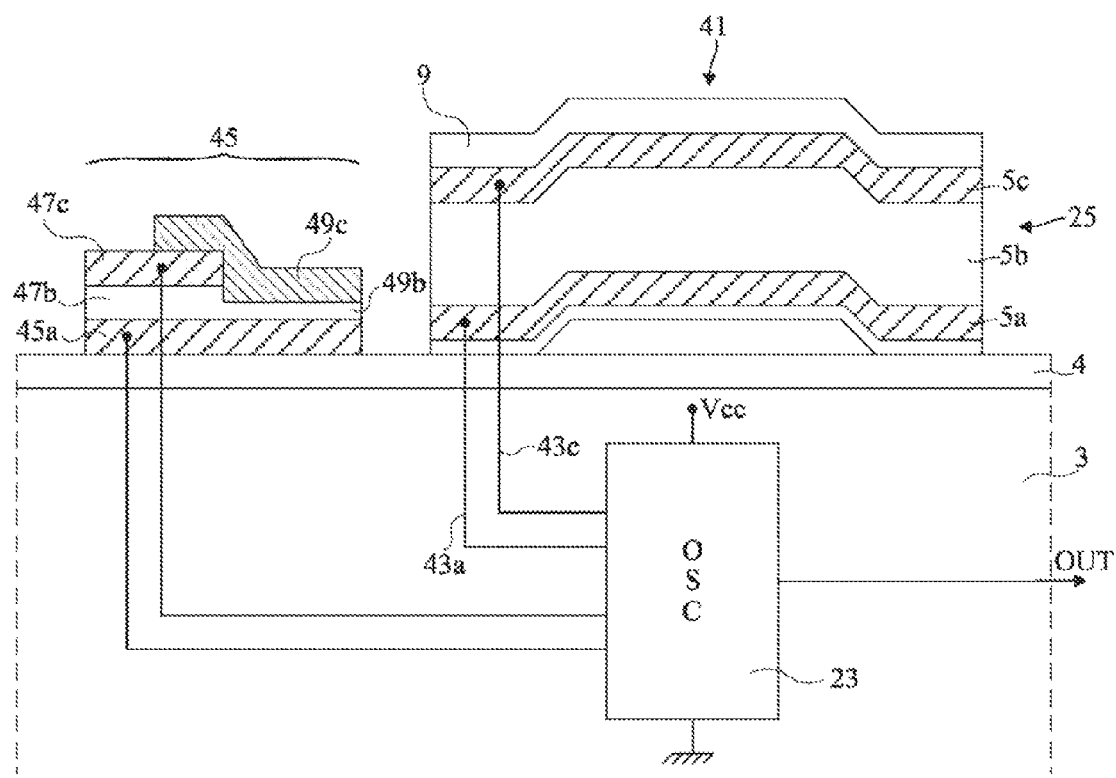

FIGS. 4 to 6 are cross-section views schematically illustrating steps of an example of a method of adjustment on manufacturing of an oscillator with a BAW resonator.

FIGS. 4 to 6 schematically show an embodiment of a monolithic oscillator with a BAW resonator 41 formed inside and on top of a semiconductor substrate 3 coated with an insulator 4. It should be noted that the presence of insulator 4 is optional. Although each of these drawings shows a single oscillator, in practice, many oscillators are formed simultaneously inside and on top of a same semiconductor wafer.

Figure 2:
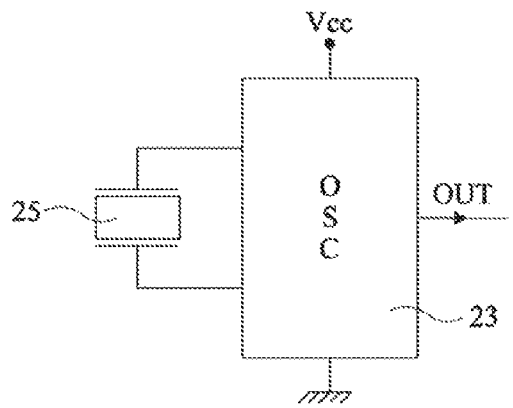
FIG. 2, previously described, shows the simplified electric diagram of an oscillator with a BAW resonator.
Figure 3:
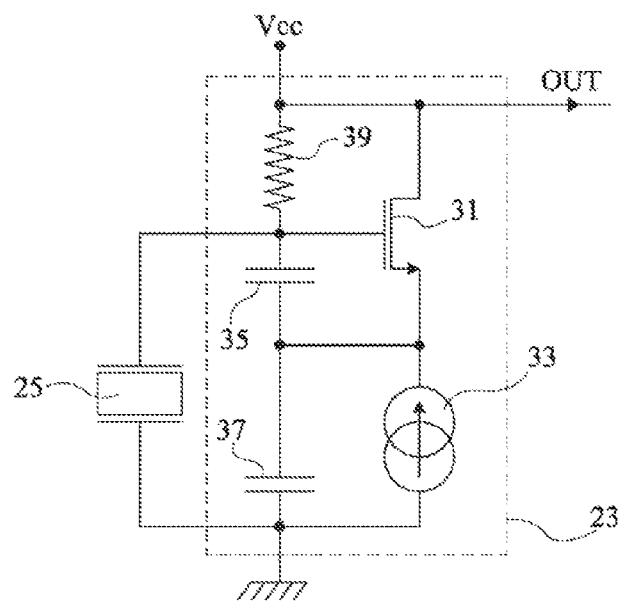
FIG. 3, previously described, shows the electric diagram of an oscillator with a Colpitts-type BAW resonator.

Various elements of a circuit 23, connected between a terminal of high voltage $V_{CC}$ and a terminal of low voltage, for example, the ground, are formed inside and on top of substrate 3. As an example, elements of a Colpitts-type oscillating circuit, such as described in relation with FIG. 2, may be formed inside and on top of substrate 3.

A BAW resonator 25 is formed above or next to substrate area 3 inside and on top of which are formed the elements of circuit 23. In this example, BAW resonator 25 is a BAW resonator deposited on a membrane, such as described in relation with FIG. 1.

Electrodes 5a and 5c of BAW resonator 25 are connected to circuit elements 23. These connections are schematically shown by lines 43a and 43c. As an example, connections 43a and 43c have vias.

An aspect of an embodiment of the present disclosure is to provide to form, next to resonator 25, an adjustable capacitor 45, this capacitor being connected to circuit elements 23 so that the oscillation frequency depends on the capacitance of this capacitor.

FIG. 4 schematically illustrates a first step of an example of a method of adjustment in the manufacture of the oscillator 41.

It is provided to form, next to the resonator 25 and above the substrate 3, a lower electrode 45a of capacitor 45, and to cover this electrode with a layer of a dielectric material. It is further provided to form, at the surface of a portion 47b of this dielectric layer, an upper electrode 47c. At this stage of the manufacturing, a portion 49b of the dielectric layer is not covered with the upper electrode 47c, and the capacitance of capacitor 45 depends on the surface of upper electrode 47c and on the thickness of the dielectric layer 47b. Electrodes 45a and 47c are connected to circuit elements 23.

The oscillator is then powered and the frequency of the output signal OUT is measured. The capacitance to be added in parallel with the current capacitance of the capacitor 45 to accurately obtain the desired oscillating frequency can be deduced therefrom.

As an example, to power the oscillator and measure its output frequency by means of test probes, contact pads (not shown) connected to the circuit elements 23 may be provided at the surface of the semiconductor wafer. In practice, several oscillators of a same wafer may be powered and tested at the same time, by using a test board having a large number of probes. Should the desired degree of accuracy allow it, the substrate wafer may be tested by areas, that is, an oscillator of a predefined area may be tested, to deduce the capacitance to be added in parallel to capacitor 45 for all the neighboring oscillators formed within this area.

FIG. 5 schematically illustrates a second step of a method of adjustment in the manufacture of the oscillator 41. Portion 49b of the dielectric layer has been thinned down to form, from this portion 49b, a capacitor precisely having the capacitance previously deduced from the oscillation frequency measurement.

Indeed, knowing that portions 47b and 49b of the dielectric layer have been deposited with the same thickness, and knowing the surfaces of portions 47b and 49b, the thinning to be undergone by dielectric portion 49b so that final capacitor 45 has the desired capacitance can be determined.

The thinning-down of dielectric portion 49b may advantageously be performed by ion etching, like the above-described step of adjustment of the resonance frequency of a BAW resonator. As an example, the semiconductor wafer on which the oscillators are formed is scanned by an etching ion beam 51. The scan speed is controlled so that the beam stays longer on the oscillators for which a greater thickness is desired to be etched. Such a thinning-down technique enables to form capacitors having highly accurate capacitances. As for the above oscillation frequency measurement step, the thinning down of dielectric 49b may be carried out simultaneously for several neighboring oscillators, for example, by increasing the diameter of the etching ion beam.

FIG. 6 schematically illustrates a final step of an example of a method of adjustment in the manufacture of the oscillator 41.

An upper electrode 49c, which is connected to the neighboring upper electrode 47c, is formed above the thinned-down portion 49b of the dielectric layer. A single capacitor 45 having exactly the desired value is thus formed.

To interconnect upper electrodes 47c and 49b, the electrode 49c is formed to at least partially cover electrode 47c. An alternative, not shown, is to provide a wire connection.

Upper electrodes 47c and 49c of the capacitor 45 preferably take up a large surface area. As an example, each of these electrodes may have a surface area approximately ranging from 1,000 $\mu m^2$ to 10,000 $\mu m^2$. As a result, the possible inaccuracies linked to the surface delimitation of the two regions of capacitor 45 are negligible.

To limit the number of manufacturing steps, materials of BAW resonator 25 are used to form capacitance 45. As an example, electrodes 45a and 47c may be formed at the same time as electrodes 5a and 5c of the BAW resonator, for example, with molybdenum. Similarly, dielectric layer 47b, 49b may be formed at the same time and with the same material as one of the following layers:

piezoelectric layer 5b, for example, made of aluminum nitride, a temperature-compensation layer, not shown, for example made of silicon oxide, currently arranged between piezoelectric layer 5b and upper electrode 5c, or upper frequency adjustment layer 9, for example, made of silicon nitride.

Upper electrode 49c requires a dedicated manufacturing step. This electrode may, for example, be made of an alloy of copper and aluminum identical to that generally used to form contact pads, not shown.

To improve the accuracy of the dielectric layer thinning-down step, it is desirable to provide, on deposition of this layer, the approximate capacitance that capacitor 45 must have. For this purpose, after the deposition of layer 47b, 49b, there is a measurement by ellipsometry of the thicknesses of the different dielectric layers forming the capacitor 45.

According to an advantage of an embodiment of the present disclosure, the provided method enables very accurate adjustment of the frequency of an oscillator in a final manufacturing step. The network of switched capacitors generally used to carry out this adjustment can thus be suppressed or reduced.

An advantage of the above-described embodiment is that it only implements conventional steps of the manufacturing of an oscillator with a BAW resonator.

One of the issues of the implementation of the BAW resonator frequency-adjustment step is that the frequency shift linked to the thickness adjustment is not constant at the scale of a wafer. This difference in the frequency sensitivity of resonators is linked to technological dispersions. The provided solution enables to adjust the frequency of the BAW resonator (and by extension, of the oscillator) by means of a capacitor having a sensitivity according to the adjusted thickness which is constant at the scale of the wafer. This property accordingly increases the accuracy that can be achieved to finely correct the oscillation frequency.

A specific application of an embodiment of the present disclosure has been described hereabove. More generally, the adjustment on manufacturing of any device having its behavior depending on the capacitance of a capacitor is provided. It is then provided, in a final manufacturing step, to test the device, then to correct possible behavior irregularities, by adjusting the capacitance of the capacitor in the way described hereabove.

As an example, such a method may be implemented to adjust on manufacturing the frequency of an oscillator based on MEMS ("MicroElectroMechanical Systems").

Further, the provided method may also be implemented to manufacture capacitors having very accurate capacitances. Errors linked to the inaccuracies of methods for depositing the different layers of a capacitance can indeed thus be corrected.

According to an alternative embodiment of the provided methods, it is provided, for the adjustment of capacitance 45, to form a temporary upper electrode covering the entire surface of the dielectric layer, to test the device, to remove the temporary upper electrode, to modify the thickness of the dielectric layer, then to form a final upper electrode. The temporary upper electrode will for example be removed by ion etching, according to the same method as the dielectric layer thinning step.

Specific embodiments of the present disclosure have been described. Various alterations and modifications will occur to those skilled in the art. In particular, a method of adjustment on manufacturing of an oscillator with a BAW resonator deposited on a membrane has been described hereabove. It will be within the abilities of those skilled in the art to implement the desired operation to adjust an oscillator with a BAW resonator mounted on a substrate.

Further, the above-described embodiments provide for thinning down, by ion etching, the dielectric layer of the capacitance to be adjusted. The present disclosure is not limited to this specific example. It will be within the abilities of those skilled in the art to use any other method capable of thinning down the dielectric layer.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A capacitor, comprising:
a first electrode;
a dielectric layer on the first electrode, the dielectric layer including a first region and a second region against the first region, the second region having a smaller thickness than a thickness of the first region;
a second electrode covering the first region; and
a third electrode, distinct from the second electrode, having a first portion directly contacting a surface of the second region and a second portion directly contacting a surface of the second electrode so that the second and third electrodes are electrically interconnected;
wherein the first portion of the third electrode directly contacts a top surface of the second electrode and the third electrode has a third portion that directly contacts a lateral surface of the second electrode.

2. The capacitor of claim 1 wherein the first and second electrodes are made of molybdenum, the third electrode is made of a copper and aluminum alloy, and the dielectric layer is made of silicon oxide.

3. The capacitor of claim 1 wherein the first electrode comprises a first plate of the capacitor and the second and third electrodes combined comprise a second plate of the capacitor.

4. The capacitor of claim 1 wherein the second electrode is made from a different material than the third electrode.

5. A capacitor, comprising:
a first electrode formed on a semiconductor substrate to form a first plate;
a dielectric layer having first and second portions formed over the first electrode;
a second electrode formed over the first portion of the dielectric layer;
a third electrode formed over the second portion of the dielectric, in direct contact with a top surface of the second electrode, and in direct contact with a side surface of the second electrode, the second and third electrodes together forming a second plate; and
wherein the second portion of the dielectric layer has a thickness that is smaller than a thickness of the first portion of the dielectric layer;
wherein the third electrode directly contacts the second region of the dielectric layer.

6. The capacitor of claim 5 wherein the second electrode is made from a different material than the third electrode.

7. A device, comprising:
a first capacitor that includes:
a first electrode;
a dielectric layer that includes first and second regions on the substrate, the second region being of a smaller thickness than a thickness of the first region;
a second electrode covering the first region; and
a third electrode, distinct from the second electrode, having a first portion directly contacting a surface of the second region, a second portion directly contacting a surface of the second electrode, and electrically connected to the second electrode, wherein the first portion of the third electrode directly contacts a top surface of the second electrode and the third electrode has a third portion that directly contacts a lateral surface of the second electrode.

8. The device of claim 7, wherein the first and second electrodes are made of molybdenum, the third electrode is made of a copper and aluminum alloy, and the dielectric layer is made of silicon oxide.

9. The device of claim 7, wherein the first electrode comprises a first plate of the capacitor and the second and third electrodes combined comprise a second plate of the capacitor.

10. The device of claim 7, wherein the first capacitor is formed on a substrate, the device further comprising:
    an oscillator circuit coupled to the first capacitor; and
    a BAW resonator formed on the substrate and coupled to the oscillator circuit, the BAW resonator including a lower electrode, an upper electrode, and a piezoelectric layer between the lower and upper electrodes.

11. The device of claim 10, wherein the first and second electrodes of the capacitor are made of the same materials as the lower and upper electrodes of the BAW resonator.

12. The device of claim 7, wherein the second electrode is made from a different material than the third electrode.

\* \* \* \* \*